US006818825B2

(12) United States Patent
Tharman

(10) Patent No.: US 6,818,825 B2
(45) Date of Patent: Nov. 16, 2004

(54) REGULATOR CONNECTOR ASSEMBLY FOR SMALL ENGINE

(75) Inventor: Paul A. Tharman, Pewaukee, WI (US)

(73) Assignee: Briggs & Stratton Corporation, Wauwatosa, WI (US)

( * ) Notice: Subject to any disclaimer, the term of this patent is extended or adjusted under 35 U.S.C. 154(b) by 175 days.

(21) Appl. No.: 10/217,400

(22) Filed: Aug. 13, 2002

(65) Prior Publication Data

US 2004/0033719 A1 Feb. 19, 2004

(51) Int. Cl.$^{7}$ .......................... H05K 7/00; H01R 11/00

(52) U.S. Cl. ........................ 174/50.52; 174/59; 174/54; 439/502

(58) Field of Search ................................ 174/50, 50.52, 174/59, 54; D13/143; 439/638, 502; 361/18, 1, 600, 601, 602, 679, 10

(56) References Cited

U.S. PATENT DOCUMENTS

| | | | | |
|---|---|---|---|---|
| 3,760,259 A | | 9/1973 | Tharman | |
| 3,778,650 A | | 12/1973 | Tharman | |
| 3,875,438 A | * | 4/1975 | Tharman | 174/54 |
| 4,233,534 A | * | 11/1980 | Tharman | 439/455 |
| 4,804,916 A | * | 2/1989 | Frank | 307/33 |
| 4,915,068 A | * | 4/1990 | Tharman | 310/68 D |
| 5,031,587 A | | 7/1991 | Tharman | |
| 5,234,363 A | | 8/1993 | Motose | |
| 5,283,513 A | | 2/1994 | Fujita et al. | |
| 5,714,871 A | | 2/1998 | Endou | |
| 5,731,690 A | | 3/1998 | Taniquchi et al. | |
| 5,771,471 A | * | 6/1998 | Alberth et al. | 363/97 |
| 5,937,829 A | | 8/1999 | Endou | |
| 6,091,231 A | | 7/2000 | Prunty et al. | |

OTHER PUBLICATIONS

"Commercial MATE–N–LOK." Data sheet [on line]. Tyco Electronics Corporation [retrieved on Aug. 1, 2002]. Retrieved from the internet <http://catalog.tycoelectronics.com/TE/bin/TE.Connect? M=BYPN&C=1&PN=1–480318–0&LG=1&I=13>. Applicant believes the product was sold at least one year prior to the filing date of this application.

"Commercial MATE–N–LOK." Data Sheet [on line]. Tyco Electronics Corporation [retrieved on Aug. 1, 2002]. Retrieved from the internet <http://catalog.tycoelectronics.com/TE/bin/TE.Connect? M=BYPN&C=1&PN=1–480319–0&LG=1&I=13>. Applicant believes the product was sold at least one year prior to the filing date of this application.

"AMP Universal MATE–N–LOK Connectors."—Product Catalog [on line]. Mouser Electronics [retrieved on Nov. 21, 2003]. Retrieved from the internet <http://www.mouser.com/catalog/615/606.pdf>.

* cited by examiner

*Primary Examiner*—Dean A. Reichard
*Assistant Examiner*—Angel R. Estrada
(74) *Attorney, Agent, or Firm*—Michael Best & Friedrich LLP

(57) ABSTRACT

An electrical power supply assembly for an internal combustion engine. In one embodiment, the assembly includes a dual circuit alternator that provides dual unregulated voltage signals to a supply connector. The supply connector is electrically connected to an input connector. A regulator receives one of unregulated voltage signals from the input connector and provides a regulated voltage signal to one contact at an output connector. A bypass conductor conducts the other unregulated voltage signal from the input connector to another contact at the output connector. The output connector is configured to be electrically connected to a dual load circuit connector. The dual load circuit connector is electrically connected to load circuits having different demands for regulated and unregulated electrical power.

13 Claims, 2 Drawing Sheets

Fig. 1

REGULATOR CONNECTOR ASSEMBLY FOR SMALL ENGINE

BACKGROUND OF THE INVENTION

The present invention relates to an electrical power supply assembly. More particularly, the invention relates to a dual-voltage supply assembly for a small engine application.

Electrical systems for small engines have become more complicated as manufacturers provide electrical features that may or may not require regulated electrical power. For example, one may recharge a battery using a regulated voltage supply. Yet, headlights typically may operate with regulated or unregulated electrical power. Existing electrical systems typically provide regulated or unregulated electrical power supplies, but seldom both. Dual regulated and unregulated power systems typically require dual stator assemblies and numerous components and connections at increased cost.

SUMMARY OF THE INVENTION

In one embodiment, the invention provides an electrical connector assembly. The electrical connector assembly includes input and output connectors that are electrically connected to a regulator and a bypass conductor. The input connector includes two contacts that receive two unregulated voltage signals. The output connector includes two contacts. One contact provides a regulated voltage signal from the regulator, while the other contact provides an unregulated voltage signal from the bypass conductor.

In another embodiment, the invention provides an electrical power supply assembly. The assembly includes a dual-voltage power supply, input and output connectors, a regulator module and a bypass conductor. The dual voltage power supply provides a first and second unregulated voltage signals. The input connector provides one of the unregulated voltage signals to a regulator module. The input connector provides the other of the unregulated voltage signals to a bypass conductor. The regulator outputs a regulated voltage signal to a first output contact at the output connector. The bypass conductor provides the unregulated voltage signal to a second contact at the output connector.

In a small engine application, the invention provides an assembly capable of providing both a regulated and an unregulated voltage signal to load circuits having different demands for regulated and unregulated power. In particular, the aspect of the regulated voltage supply substantially prevents a battery from overcharging in a small engine. The configurations of the input and output connectors of the invention enhances the ability to readily connect and disconnect the assembly with existing systems. The invention also provides an assembly that provides a regulated and an unregulated voltage signal with fewer components.

As is apparent from the above, it is an aspect of the invention to provide an electrical power supply assembly that provides both a regulated and an unregulated voltage signal. Other features and aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

Figure 1:
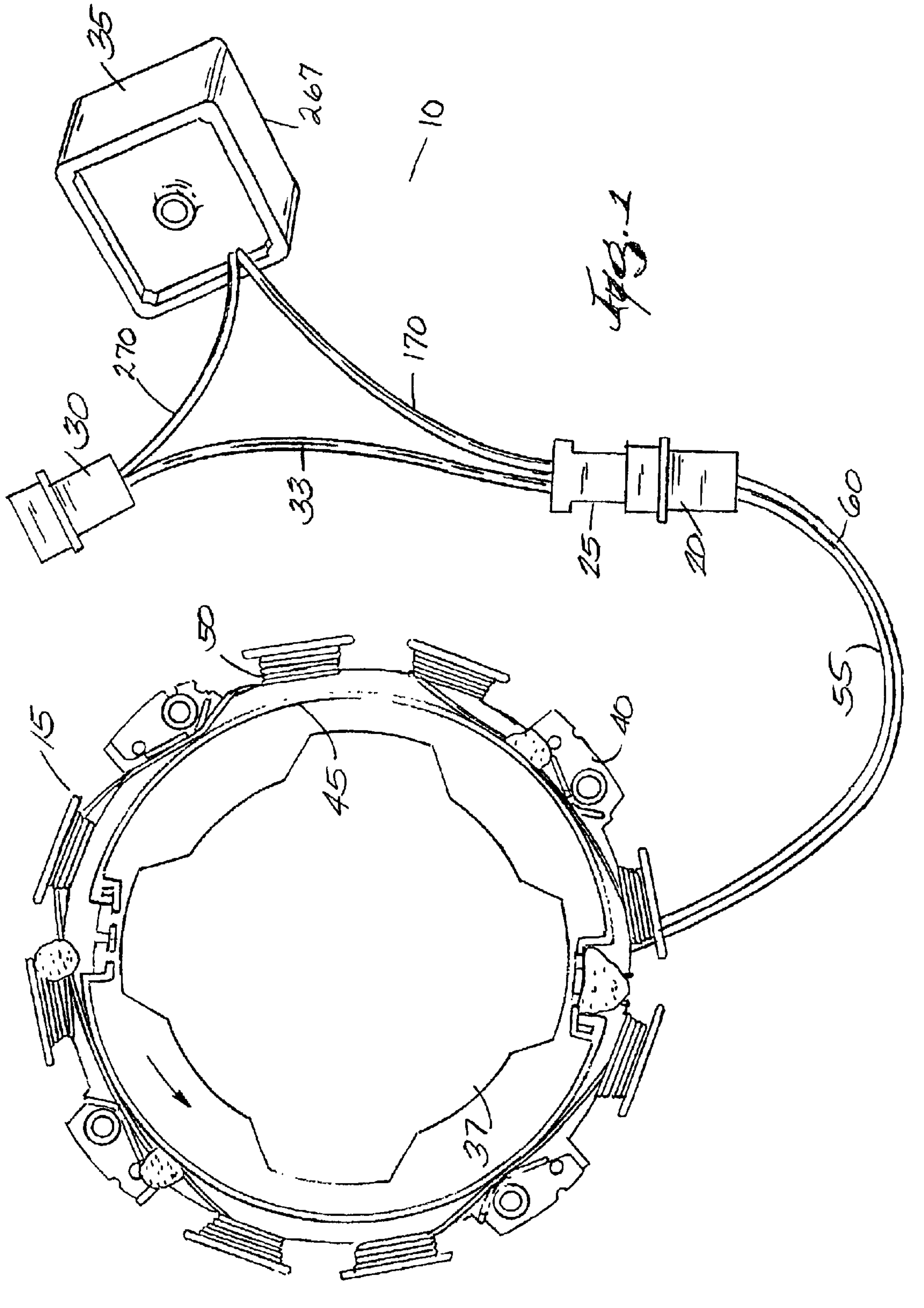
FIG. 1 is a perspective view of an exemplary electrical power supply assembly embodying the invention.

Referring to the drawings, FIG. 1 illustrates an exemplary embodiment of the electrical power supply assembly 10 embodying the invention. The assembly includes a dual circuit alternator 15, a supply connector 20, an input connector 25, an output connector 30, a bypass conductor 33, and a regulator 35. The output connector 30 can be coupled to provide regulated and unregulated electrical power to meet the demands of designated load circuits (not shown).

The dual circuit alternator 15 provides dual unregulated voltage signals to the supply connector 20. The dual circuit alternator 15 as used herein encompasses not only alternators, but also generators used in connection with internal combustion engines. In general, the dual circuit alternator 15 includes a rotor 37 and a stator 40. The engine's crankshaft (not shown) rotates one or more permanent magnets on the rotor and adjacent to stator 40. Alternatively, the magnets could be stationary and the coils could be moved. The stator 40 includes an armature 45 and a plurality of spaced windings or wire coils 50 arranged circumferentially about the outer surface of the armature 45. The rotating magnets provide a moving magnetic field that induces a voltage in the spaced windings 50 of the stator 40.

The unregulated, alternating voltage signals generated by the dual circuit alternator 15 are output to conductors 55 and 60. The conductors 55 and 60 provide the unregulated voltage signals to the supply connector 20. FIG. 1 illustrates only one embodiment of a stator 40 employed by the dual circuit alternator 15. Of course, the invention can be used with various other stator designs having a different number of or spacing of windings 50.

Figure 2:
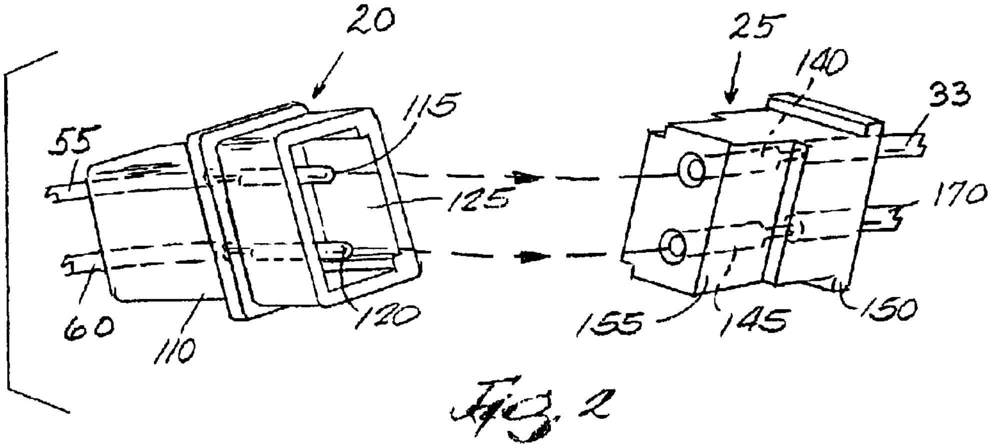
FIG. 2 is a perspective view of exemplary connectors having a male adapter matable to a female adapter embodying the invention.

As illustrated in FIG. 1, the supply connector 20 is electrically connected to an input connector 25 of the assembly 10. One embodiment of the supply 20 and input connectors 25 is a dual plug and receptacle, respectively, as shown in FIG. 2. The supply connector 20 includes a housing 110 made of insulating material that retains two pin contacts 115 and 120. The housing 110 is generally rectangular in cross-section and has a female adapter portion 125. The conductors 55 and 60 from FIG. 1 are electrically connected to the pin contacts 115 and 120 enclosed in housing 110. The pin contacts 115 and 120 extend from the female adapter portion 125 and are electrically connected to socket contacts 140 and 145 retained in the input connector 25.

As shown in FIG. 2, one embodiment of the input connector 25 includes the socket contacts 140 and 145 retained in a housing 150 of insulating material. The socket contacts 140 and 145 are electrically connected to conducting wires 33 and 152 from FIG. 1. The housing 150 is also generally rectangular in cross section and includes a male adapter portion 155 for mating to the female adapter portion 125 of the supply connector 20. The configurations of the male 155 and female 125 adapter portions are such that the pin contacts 115 and 120 of the connector 20 mate with the socket contacts 140 and 145 respectively of the connector 25. Thereby, the correct form of regulated or unregulated power is provided to meet the demands of the load circuits (discussed below). Exemplary connectors 20 and 25 include AMP Commercial MATE-N-LOK™ Part Nos 1-480319-0 and 1-480318-0, respectively. Of course, other types of adapters and/or contacts can be used as connectors 20 and 25. Additionally, the male and female connectors can be reversed The use of the dual connectors 20 and 25 illustrated in FIG. 2 enhances the ability to readily connect and disconnect the assembly 10, so that the invention may be retrofit onto existing equipment or used as an option for new equipment.

Figure 3:
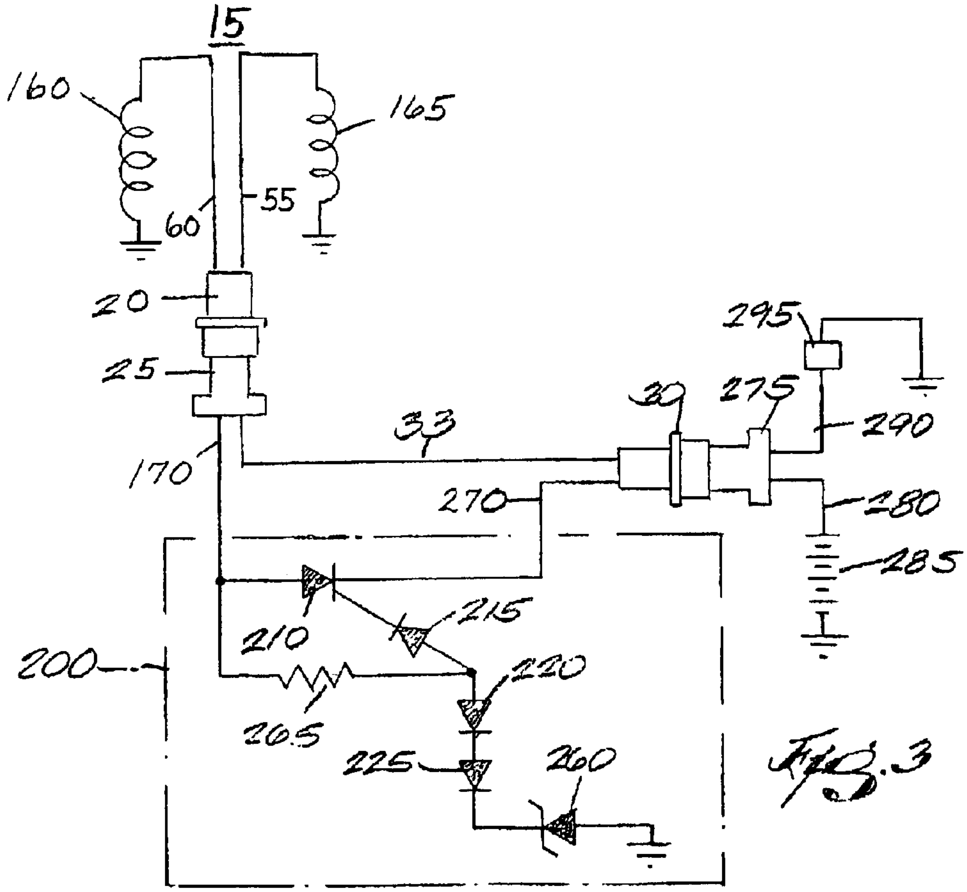
FIG. 3 is a circuit diagram of an exemplary electrical power supply assembly embodying the invention.

FIG. 3 is a schematic diagram of an exemplary embodiment of the invention. Stator 15 includes coils 160 and 165 that each provide an unregulated voltage signal to the supply connector 20. Alternatively, a single tapped coil can be used. As discussed above, the supply connector 20 is electrically connected to input connector 25. One of the sockets 140 and 145 of the input connector 25 shown in FIG. 2 is electrically connected to bypass conductor 33. The other of the sockets 140 and 145 is electrically connected via conductor 170 to the regulator 35.

The regulator 35 supplies a regulated voltage signal to a load circuit. One embodiment of the regulator 35 is a half-wave regulator 200 as shown in FIG. 3. In general, the half wave regulator 200 rectifies one-half of the unregulated, alternating voltage signal generated by the dual circuit alternator 15. The half-wave regulator 200 includes a silicon-controlled rectifier (SCR) device 210 connected to a plurality of diodes 215, 220, and 225; zener diode 260 and resistor 265. An exemplary embodiment of the discrete components in the half-wave regulator 200 includes a one hundred volt, 5 amp SCR device; three 1 amp, 400 volt diodes; a 14 volt, 1 watt zener diode; and a 120 ohm resistor. The exemplary embodiment of the half wave regulator 200 is electrically grounded to a housing or module 267 (see FIG. 1) retaining the discrete components of the half wave regulator 200. Of course, other designs of the half-wave regulator 200 are possible. For example, one or more discrete components of the half-waver regulator 200 can be replaced with an integrated chip. In another embodiment, a full-wave regulator can be used in place of the half wave regulator, but at increased cost.

As shown in FIG. 3, the output connector 30 receives the regulated voltage signal from the regulator 35 via conductor 270 and the unregulated voltage signal from the bypass conductor 33. In the exemplary embodiment, the output connector 30 is similar to the receptacle as described above for the supply connector 25 and as shown in FIG. 2. One of the output connector's pin contacts is electrically connected to an electrical conductor 270 from the regulator 35. The other of the output connector's pin contacts is electrically connected to the bypass conductor 33. Thereby, the output connector 30 provides regulated power to one output pin contact and unregulated power to the other output pin contact. This aspect of the invention provides regulated and unregulated voltage signals to the output connector 30 for electrical connection to load circuits having different demands for regulated and unregulated electrical power. Additionally, this aspect of the invention enables regulated and unregulated power to be provided to designated load circuits with fewer components to connect and/or disconnect.

FIG. 3 shows the output connector 30 couples to a load connector 275. In the exemplary embodiment, the load connector 275 is similar to the plug described above for the input connector 25 and as shown in FIG. 2. By coupling the output connector 30 to the load connector 275, the pin contacts of the output connector 30 electrically connect to the respective socket contacts of the load connector 275. FIG. 3 shows that each socket contact of the load connector 275 is electrically connected to a load circuit having different demands for regulated and unregulated electrical power. As noted above and as shown in FIG. 2, the configurations of the male 155 and female 125 adapter portions of the output 30 and load 275 connectors is such that the pin contacts of output connector 30 connect to the respective socket contacts of the load connector 275. Thereby, the assembly 10 provides the correct regulated and unregulated power to meet the demands of the respective load circuit. Of course, the types of connectors used for the output 30 and load connectors 275 described above and as shown in FIG. 2 can be reversed. For example, another embodiment of the invention can use a plug similar to connector 20 for the output connector 30 and a receptacle similar to connector 25 for the load connector 275. Additionally, the invention can use types of connectors and electrical connections other than those illustrated in the figures.

In the exemplary embodiment of the invention as shown in FIG. 3, a first load circuit 280 is electrically connected to the socket contact of load connector 275 that receives the regulated voltage signal. The regulated voltage signal functions to recharge a battery 285. It is desirable to use regulated power to charge the battery to prevent overcharging. Of course, the first load circuit 280 can include other electrical devices that use regulated electrical power. The second load circuit 290 is electrically connected to the socket contact at load connector 275 that receives the unregulated voltage signal. The unregulated voltage signal functions to power any load device 295 that does not prefer regulated electrical power (e.g., headlights, etc.).

Thus, the invention provides, among other things, an exemplary power supply assembly for providing regulated and unregulated electrical power to meet the different demands at designated load circuits. Various features and advantages of the invention are set forth in the following claims.

What is claimed is:

1. An electrical connector assembly for an internal combustion engine, comprising:

an input connector having a first input contact and a second input contact;

an output connector having a first output contact and a second output contact;

a regulator that receives an unregulated voltage signal from one of the first and the second input contacts and that outputs a regulated voltage signal to one of the first and the second output contacts; and a bypass conductor connected between the other of the first and the second input contacts and the other of the first and the second output contacts.

2. The electrical connector assembly as claimed in claim 1, wherein the unregulated voltage signal is sinusoidal.

3. The electrical connector assembly as claimed in claim 1, wherein said regulator is disposed in a module.

4. The electrical connector assembly as claimed in claim 1, wherein the input connector further includes:

an insulated housing that retains the first and second input contacts.

5. The electrical connector assembly as claimed in claim 4, wherein the insulated housing of the input connector is adapted to connect to a supply connector.

6. The electrical connector assembly as claimed in claim 4, wherein the insulated housing of the input connector has a substantially rectangular shape in cross-section.

7. The electrical connector assembly as claimed in claim 4, wherein the insulated housing of the input connector includes a female adapter that is substantially rectangular in cross-section.

8. The electrical connector assembly as claimed in claim 1, wherein the output connector further includes:

an insulated housing that retains the first and second output contacts.

9. The electrical connector assembly as claimed in claim 8, wherein the insulated housing of the output connector is adapted to connect to a load connector.

10. The electrical connector assembly as claimed in claim 8, wherein the insulated housing of the output connector has a substantially rectangular shape in cross-section.

11. The electrical connector assembly as claimed in claim 8, wherein the insulated housing of the output connector includes a female adapter that is substantially rectangular in cross-section.

12. The electrical connector assembly as claimed in claim 1, wherein the first and second input contacts are electrical sockets.

13. The electrical connector assembly as claimed in claim 1, wherein the first and second output contacts are electrical pins.

* * * * *